(12) United States Patent
Yoshihara

(10) Patent No.: US 6,410,194 B1
(45) Date of Patent: Jun. 25, 2002

(54) RESIST FILM FORMING METHOD AND RESIST COATING APPARATUS

(75) Inventor: Kosuke Yoshihara, Kumamoto-Ken (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 09/497,156

(22) Filed: Feb. 3, 2000

(30) Foreign Application Priority Data

Feb. 4, 1999 (JP) .......................................... 11-027451

(51) Int. Cl.$^7$ ............................... G03F 7/00; B05D 1/00
(52) U.S. Cl. ........................ 430/30; 430/311; 430/312; 430/322; 430/327; 430/935; 427/9; 427/160; 427/240
(58) Field of Search .......................... 430/30, 311, 312, 430/322, 327, 935; 427/9, 160, 240

(56) References Cited

U.S. PATENT DOCUMENTS 4,738,910 A * 4/1988 Ito et al. ........................ 430/30
5,965,310 A * 10/1999 Yamana ........................ 430/30
5,968,691 A * 10/1999 Yoshioka et al. ............. 430/30

FOREIGN PATENT DOCUMENTS

JP 7-240362 * 2/1994

* cited by examiner

*Primary Examiner*—Mark F. Huff
*Assistant Examiner*—Nicole Barreca
(74) *Attorney, Agent, or Firm*—Rader, Fishman & Grauer, PLLC

(57) ABSTRACT

When a resist film is formed by discharging a resist solution onto the front face of a wafer housed in a cup, a relation between the film thickness of a resist film and the line width of a circuit pattern when the resist film is exposed into a predetermined pattern and thereafter developed is obtained in advance, from that relation, a line width with less variations corresponding to the changes in film thickness of the resist film is selected from among line widths within a designated region to form a resist film to have the film thickness corresponding to the selected line width. Accordingly, the line width of the circuit pattern after development is not likely to vary regardless of the changes in film thickness of the resist film formed on the wafer.

5 Claims, 12 Drawing Sheets

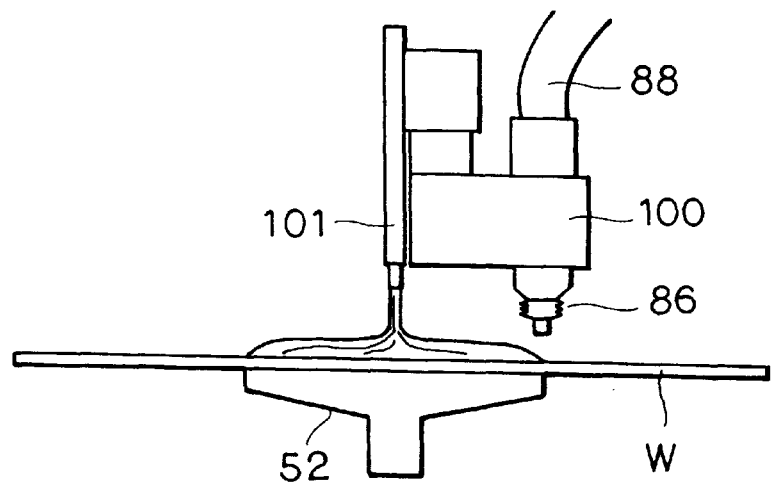
F I G. 7 A
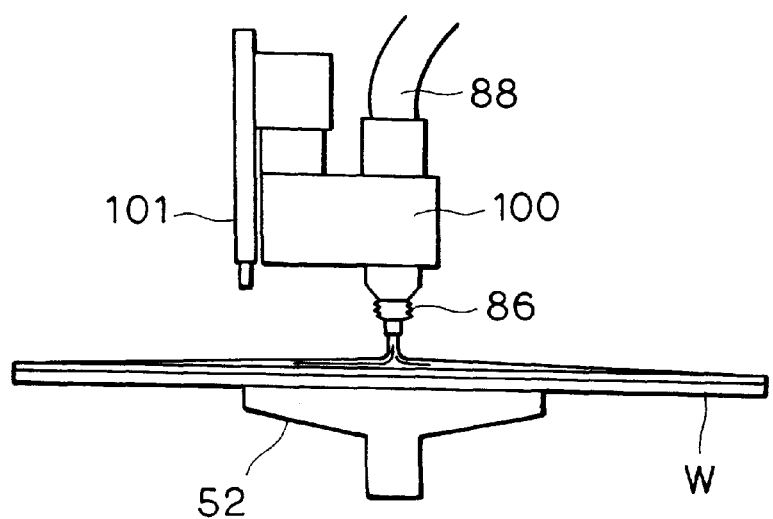
F I G. 7 B

RESIST FILM FORMING METHOD AND RESIST COATING APPARATUS

BACKGROUND OF THE INVENTION

1. Field of the Invention

The present invention relates to a resist film forming method and a resist coating apparatus for forming a resist film on the front face of a substrate such as a semiconductor wafer, a liquid crystal display device (LCD) substrate or the like.

2. Description of the Related Art

In a process of photolithography in the fabricating process of a semiconductor device, for example, a resist coating processing for forming a resist film on the front face of a semiconductor wafer, and after an exposure processing of a pattern to the semiconductor wafer coated with a resist, a developing processing for developing the pattern, are performed. In the resist coating processing, a spin coating method or the like is often employed as a method for coating with a resist solution on the front face of the semiconductor wafer uniformly.

FIG. 12 shows an appearance of a conventional coating processing unit using the above spin coating method. For instance, in a state where a semiconductor wafer W is securely held by vacuum adherence by means of a spin chuck 141, the semiconductor wafer W is rotated with the spin chuck 141 by means of a rotary drive means (not shown), and a resist solution is dripped onto almost the center of the front face of the wafer W from a resist nozzle 142 disposed above the semiconductor wafer W. The dipped resist solution is spread out in the direction of the radius of the wafer W by centrifugal force. Thereafter the dripping of the resist solution is stopped, and the semiconductor wafer is rotated at a predetermined speed to thereby draining the excess resist and drying the semiconductor wafer W. As a result, a resist film with a predetermined thickness is formed on the semiconductor wafer.

Moreover, in processes after the resist solution coating process, the semiconductor wafer coated with the resist solution is subjected to prebaking processing and cooling processing. Thereafter the semiconductor wafer is subjected to exposure processing by means of an aligner, and then post-exposure baking processing and cooling processing, thereafter developing processing to form a circuit pattern with a predetermined line width, and then post-bake processing is performed.

SUMMARY OF THE INVENTION

When the relation between the film thickness of the resist film on the semiconductor wafer and the line width of the circuit pattern which is formed on the semiconductor wafer in such a manner that the resist film is exposed into a predetermined pattern and thereafter developed is graphed, a predetermined curved line is obtained. Therefore, when the line width of the circuit pattern is designated, the film thickness of the resist film can be determined in correspondence with the line width of the circuit pattern from the curved line.

The circuit pattern needs to be formed with quite high accuracy. However, since the film thickness of the resist film somewhat varies, there occurs a case where variations in line width corresponding to changes in it resist film does not satisfy the required accuracy depending on the designated film thickness of the resist film. Accordingly, it is required that a line width has less variations corresponding to the changes in resist film thickness and that a line width with required accuracy can be obtained even within a normal range of the resist film variations.

An object of the present invention is to provide a resist film forming method and a resist coating apparatus in which the line width of a circuit pattern after development is not likely to vary regardless of changes in film thickness of the resist film formed on a substrate.

To solve the above problem, according to the first aspect of the present invention, in a resist film forming method for forming a resist film by supplying a resist solution onto the front face of a substrate housed in a processing case, a relation between the film thickness of a resist film and the line width of a circuit pattern when the resist film is exposed into a predetermined pattern and thereafter developed is obtained in advance, from that relation, a line width with less variations corresponding to the changes in resist film thickness is selected from among line widths within a designated region to form a resist film to have the film thickness corresponding to the selected line width.

In this case, the relation between the resist film thickness and the line width of the circuit pattern is a relation that the line width of the circuit pattern varies in a wave form corresponding to the resist film thickness, from that relation, a line width of an approximately maximum value or an approximately minimum value is selected from among line widths within a designated region and the resist film can be formed to have the film thickness corresponding to the selected line width.

According to the second aspect of the present invention, a resist coating apparatus for forming a resist film by supplying a resist solution to the front face of a substrate housed in a processing case comprises: rotation means for rotating the substrate at a variable speed; a resist solution supply nozzle for supplying the resist solution to the substrate; and a control mechanism for controlling a rotation condition of the rotation means and the supply amount of the resist solution supply nozzle, in which a relation between the film thickness of the resist film and the line width of a circuit pattern when the resist film is exposed into a predetermined pattern and thereafter developed is set, from that relation, a line width with less variations corresponding to the changes in resist film thickness is selected from among line widths within a designated region, so that the resist film is formed to have the film thickness corresponding to the selected line width.

According to the present invention, the relation between the film thickness of the resist film and the line width of the circuit pattern when the resist film is exposed into a predetermined pattern and thereafter developed is obtained in advance, from that relation, a line width with less variations corresponding to the changes in resist film thickness is selected from among line widths within a designated region to form the resist film to have the film thickness corresponding to the selected line width. Therefore, the line width of the circuit pattern after development can be made to resist variation regardless of changes in film thickness of the resist film formed on the substrate. Specifically, since the relation between the film thickness of the resist film and the line width of the circuit pattern is a relation that the line width of the circuit pattern varies in a wave form corresponding to the resist film thickness, from that relation, a line width of an approximately maximum value or an approximately minimum value is selected from among line widths within a designated region and the resist film is formed to have the film thickness corresponding to the selected line width, thereby variations in line width of the circuit pattern corresponding to the changes in resist film thickness can be made quite small.

These objects and still other objects and advantages of the present invention will become apparent upon reading the following specification when taken in conjunction with the accompanying drawings.

BRIEF DESCRIPTION OF THE DRAWINGS

FIGS. 7A and 7B are schematic diagrams showing a state where a thinner is discharged from a thinner nozzle and a state where a resist solution is discharged from a resist nozzle;

DETAILED DESCRIPTION OF THE PREFERRED EMBODIMENT

Figure 1:
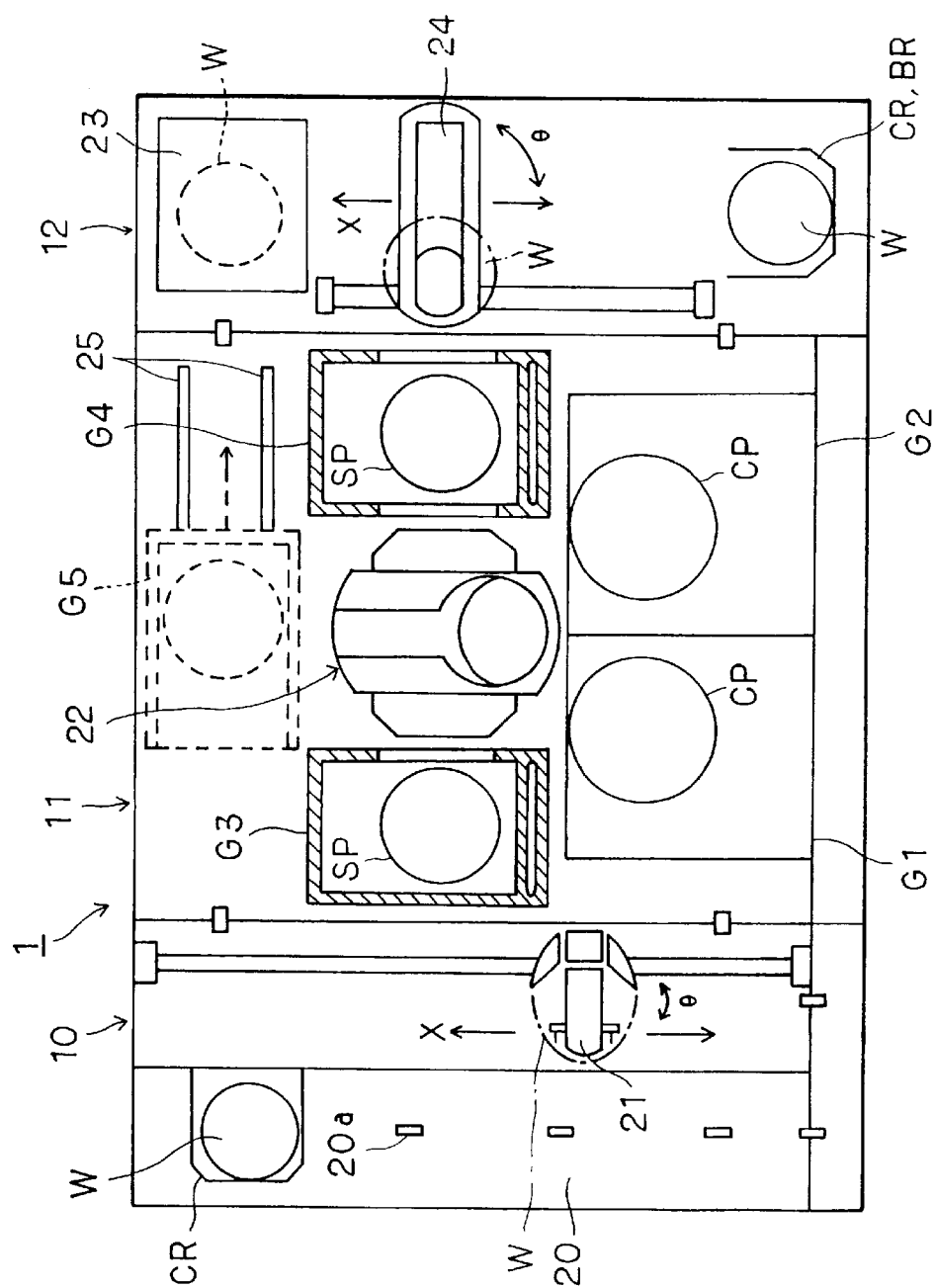
FIG. 1 is a plan view showing the whole structure of a coating and developing processing system for a semiconductor wafer, which is an embodiment of the present invention.
Figure 2:
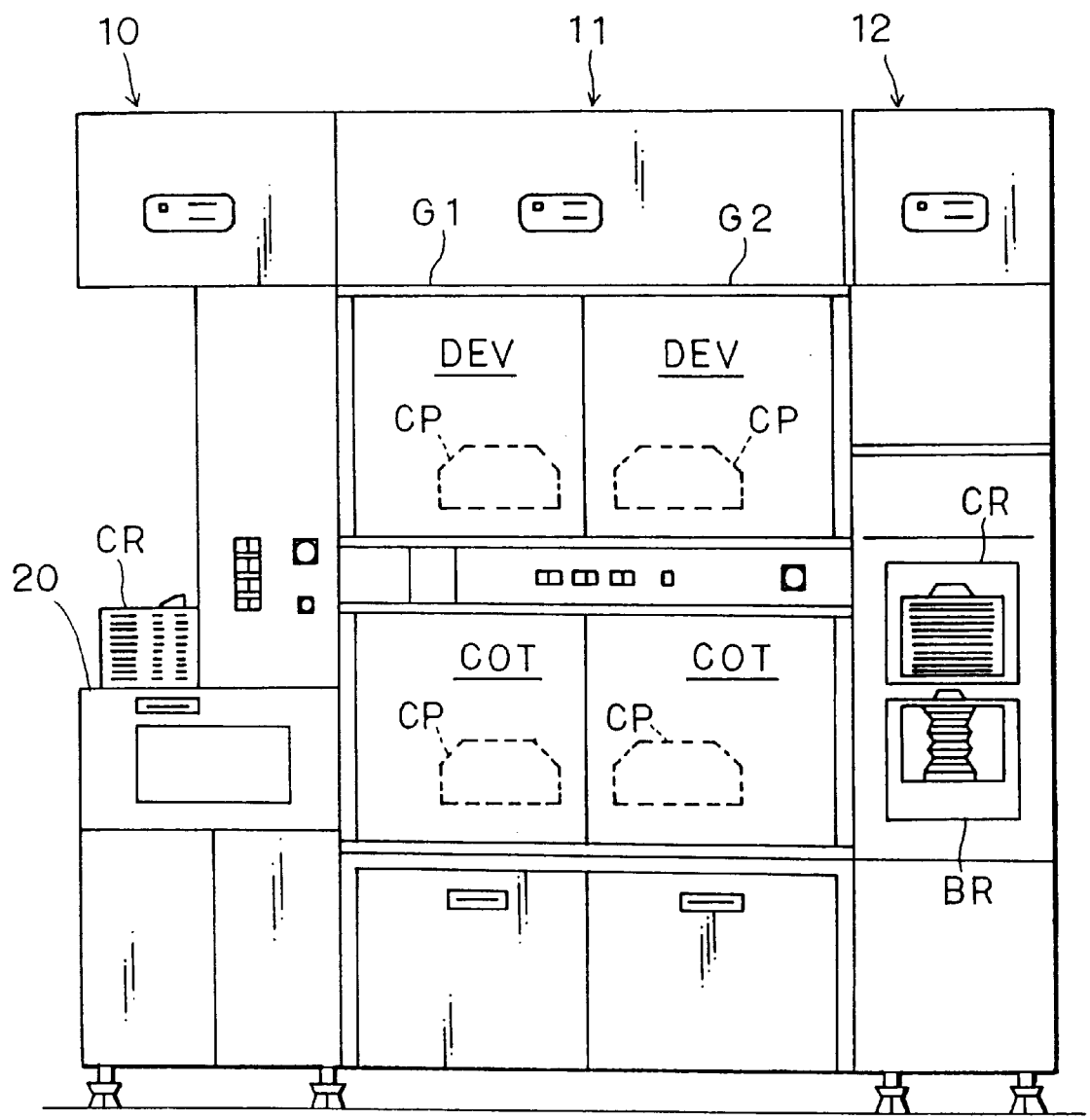
FIG. 2 is a front view of the coating and developing processing system shown in FIG. 1.
Figure 3:
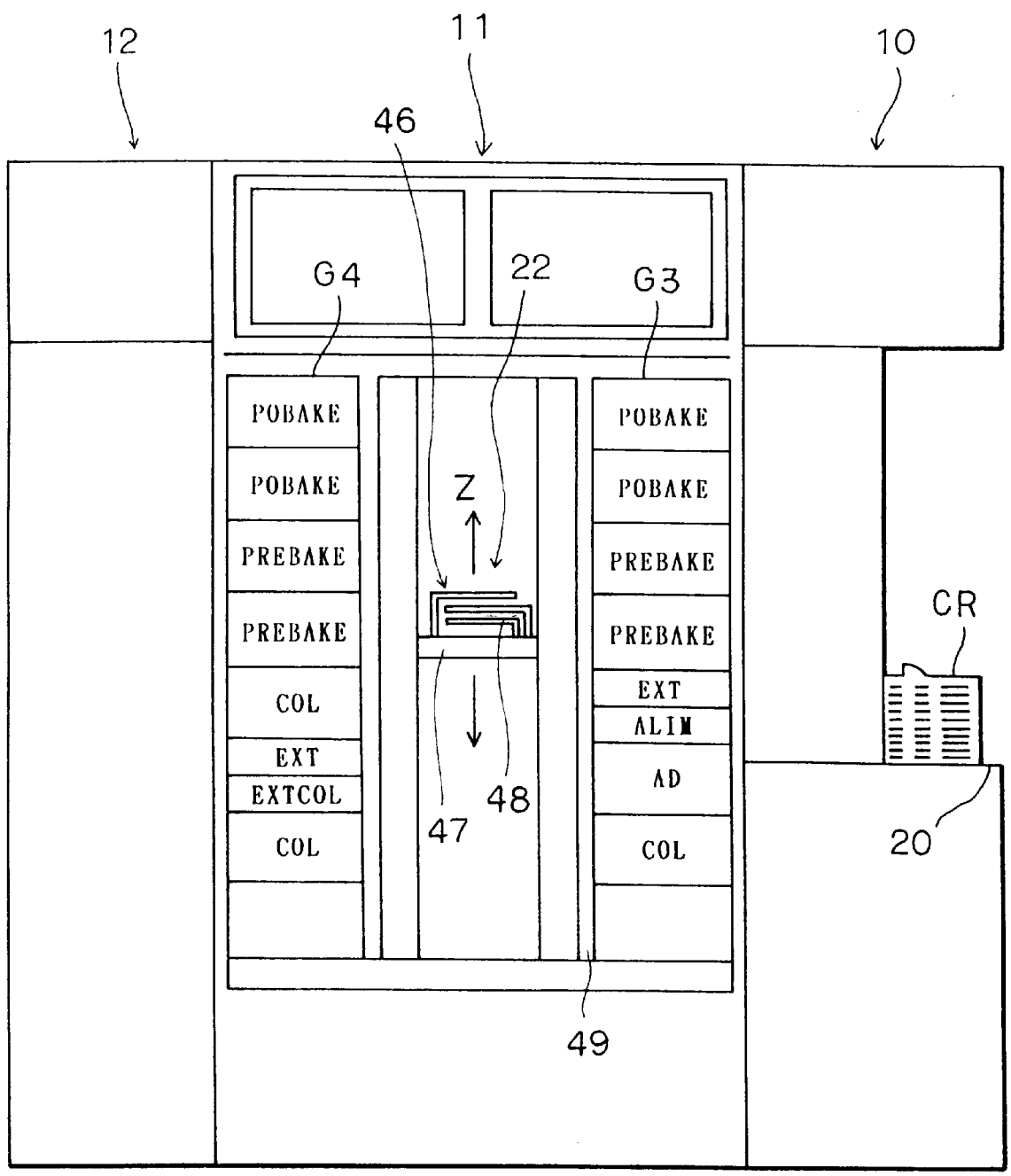
FIG. 3 is a rear view of the coating and developing processing system shown in FIG. 1.

Now, an embodiment of the present invention will be described with reference to the accompanying drawings. FIG. 1 to FIG. 3 are views of the whole structure of a coating and developing processing system 1 for a semiconductor wafer (hereinafter referred to as "a wafer") in which the embodiment of the present invention is employed. FIG. 1, FIG. 2, and FIG. 3 show the plan, the front, and the rear thereof respectively.

As shown in FIG. 1, the coating and developing processing system 1 has a configuration in which a cassette station 10 for transferring a plurality of wafers W as objects to be processed, for example, 25 wafers per wafer cassette CR from/to the outside to/from the system, and for carrying wafers W into/out of the wafer cassette CR, a processing station 11 in which various processing units are multi-tiered at designated positions and each processing unit gives predetermined processing to the wafers W one by one in a coating and a developing step, and an interface section 12 for sending and receiving the wafer W to/from an aligner (not shown) which is disposed adjacent to the processing station 11 are integrally connected.

In the cassette station 10, as shown in FIG. 1, a plurality of, for example, a maximum of four wafer cassettes CR are mounted in a line in an X-direction, with the respective ports for the wafer W facing the side of the processing station 11 at positions of positioning projections 20a on a cassettes mounting table 20. A wafer transfer body 21 movable in the direction of arrangement of the cassettes (an X-direction) and in the direction of arrangement of the wafers housed in the wafer cassettes CR (a Z-direction; a vertical direction), is selectively accessible to each wafer cassette CR.

The wafer transfer body 21 is also structured to be rotatable in a θ-direction so that it is accessible to an alignment unit (ALIM) and an extension unit (EXT) which are included in a third processing unit group $G_3$ on the processing station 11 side as described later.

In the processing station 11, as shown in FIG. 1, a vertical transfer-type main wafer transfer mechanism 22 including a wafer transfer device is provided, and all processing units of one group or divided into plural groups are multi-tiered around the main wafer transfer mechanism 22.

As shown in FIG. 3, in the main wafer transfer mechanism 22, a wafer transfer device 46 is provided to be ascendable and descendable in a vertical direction (the Z-direction) within a cylindrical supporter 49. The cylindrical supporter 49 is joined to a rotating shaft of a motor (not shown) and rotates on the rotating shaft integrally with the wafer transfer device 46 by rotational driving force of the motor. Thereby, the wafer transfer device 46 is rotatable in the θ-direction. Incidentally, the cylindrical supporter 49 may be joined to another rotating shaft (not shown) rotated by the above motor.

In the wafer transfer device 46, provided are a plurality of holding members 48 movable in the longitudinal direction of a transfer base 47. The holding members 48 realize the delivery of the wafer W between the processing units.

As shown in FIG. 1, five processing unit groups $G_1$, $G_2$, $G_3$, $G_4$, and $G_5$ can be arranged in this embodiment. It is possible that the multi-tiered units of the first and the second processing unit groups $G_1$ and $G_2$ are arranged at the front (this side in FIG. 1) side of the system, the multi-tiered units of the third processing unit group $G_3$ are disposed adjacent to the cassette station 10, the multi-tiered units of the fourth processing unit group $G_4$ are disposed adjacent to the interface section 12, and the multi-tiered units of the fifth processing unit group $G_5$ are disposed on the back side.

As shown in FIG. 2, in the first processing unit group $G_1$, two spinner-type processing units in which the wafer W is mounted on a spin chuck and subjected to predetermined processing in a cup CP, for example, a resist coating processing unit (COT) and a developing unit (DEV) are two-tiered from the bottom in order. Also in the second processing unit group $G_2$, two spinner-type processing units, for example, a resist coating processing unit (COT) and a developing unit (DEV) are two-tiered from the bottom in order. It is preferable to arrange these resist coating processing units (COT) at the lower stage since drainage of a resist solution is troublesome in terms of mechanism and maintenance. However, it is naturally possible to properly arrange them at the upper stage as required.

As shown in FIG. 3, in the third processing unit group $G_3$, oven-type processing units in which the wafer W is mounted on a mounting table SP and subjected to predetermined processing, for example, a cooling unit (COL) for cooling processing, an adhesion unit (AD) for performing hydrophobic processing to enhance fixation of a resist, an alignment unit (ALIM) for alignment, an extension unit (EXT), a prebaking unit (PREBAKE) for heating processing before exposure processing, and a postbaking unit (POBAKE) for heating processing after exposure processing are, for example, eight-tiered from the bottom in order.

Also in the fourth processing unit group $G_4$, oven-type processing units, for example, a cooling unit (COL), an extension and cooling unit (EXTCOL), an extension unit (EXT), a cooling unit (COL), a prebaking unit (PREBAKE), and a postbaking unit (POBAKE) are, for example, eight-tiered in order from the bottom.

As described above, by arranging a cooling unit (COL) and an extension and cooling unit (EXTCOL) having a low processing temperature at the lower stage and a prebaking unit (PREBAKE), a post baking unit (POBAKE), and an adhesion unit (AD) having a high processing temperature at the upper stage, the mutual heat interference between units can be reduced. It is natural that random multistage arrangement is possible.

As shown in FIG. 1, while the interface section 12 has the same size as the processing station 11 in a depth direction (the X-direction), it is made to be smaller in size than the processing station 11 in a width direction (the Y-direction). In the interface section 12, a transportable pickup cassette CR and a fixed-type buffer cassette BR are two-tiered at the front, a peripheral aligner 23 is disposed at the rear, and a wafer transfer body 24 is further provided at the center. The wafer transfer body 24 moves in the X-direction and the Z-direction to access to both the cassettes CR and BR and the peripheral aligner 23. The wafer transfer body 24 is also rotatable in the θ-direction to be accessible to the extension unit (EXT) disposed in the multi-tiered units of the fourth processing unit group $G_4$ on the processing station 11 side and to a wafer delivery table (not shown) on the adjacent aligner side.

In the coating and developing processing system 1, as shown in FIG. 1, the multi-tiered units of the fifth processing unit group G, shown by the broken line can be also disposed on the back side of the main wafer transfer mechanism 22 as described above. The multi-tiered units of the fifth processing unit group $G_5$ can be shifted laterally seen from the main wafer transfer mechanism 22 along guide rails 25. Accordingly, even when the multi-tiered units of the fifth processing unit group $G_5$ are provided as shown in the illustration, the multi-tiered units move along the guide rails 25, thereby securing a space. As a result, the maintenance operation for the main wafer transfer mechanism 22 can be easily performed from the back thereof. Moreover, even if the multi-tiered units of the fifth processing unit group $G_5$ are structured, not limited to shift sliding linearly along the guide rails 25, but to shift turning toward the outside of the system as shown by the dotted line with a reciprocating turning arrow in FIG. 1, a space for the maintenance operation for the main wafer transfer mechanism 22 can be easily obtained.

In the resist coating and-developing processing system as above, one wafer W is taken out of the wafer cassette CR by the wafer transfer body 21 in the cassette station 10 and transferred to the extension unit (EXT) of the processing unit group $G_3$. The wafer W is first transferred to the adhesion unit (AD) by the wafer transfer device 46 of the main wafer transfer mechanism 22 and subjected to hydrophobic processing (HMDS processing) for enhancing fixation of the resist. Since this processing is attended with heating, the wafer W is then transferred to the cooling unit (COL) by the wafer transfer device 46 to be cooled. Sequentially, the wafer W is transferred to the resist coating processing unit (COT) by the wafer transfer device 46 to be provided with a coating film as described later.

After the completion of the coating processing, the wafer W is subjected to prebaking processing in the prebaking unit (PREBAKE), and thereafter is cooled in the cooling unit (COL). The cooled wafer W is transferred to the alignment unit (ALIM) and subjected to alignment there, and then is transferred to the extension unit (EXT) of the processing unit group $G_4$.

Then, the wafer W is transferred to the interface section 12 by the wafer transfer body 24 and the periphery thereof is exposed by means of the peripheral aligner 23 to remove the excess resist. Thereafter, the wafer W is exposed into a predetermined pattern by the aligner (not shown) provided adjacent to the interface section 12.

The exposed wafer W is returned to the interface section 12 and transferred to the extension unit (EXT) by the wafer transfer body 24. The wafer w is transferred to one of the postbaking units (POBAKE) by the wafer transfer device 46 and subjected to post-exposure baking processing and then cooled by the cooling unit (COL).

Thereafter, the wafer W is transferred to the developing unit (DEV) and the exposed pattern is developed there. After the completion of the development, the wafer W is transferred to one of the postbaking units (POBAKE) and subjected to post-baking processing and then cooled by the cooling unit (COL). After the completion of a series of such processing, the wafer W is returned to the cassette station 10 through the extension unit (EXT) of the processing unit group $G_3$ and stored in one of the cassettes CR.

Figure 4:
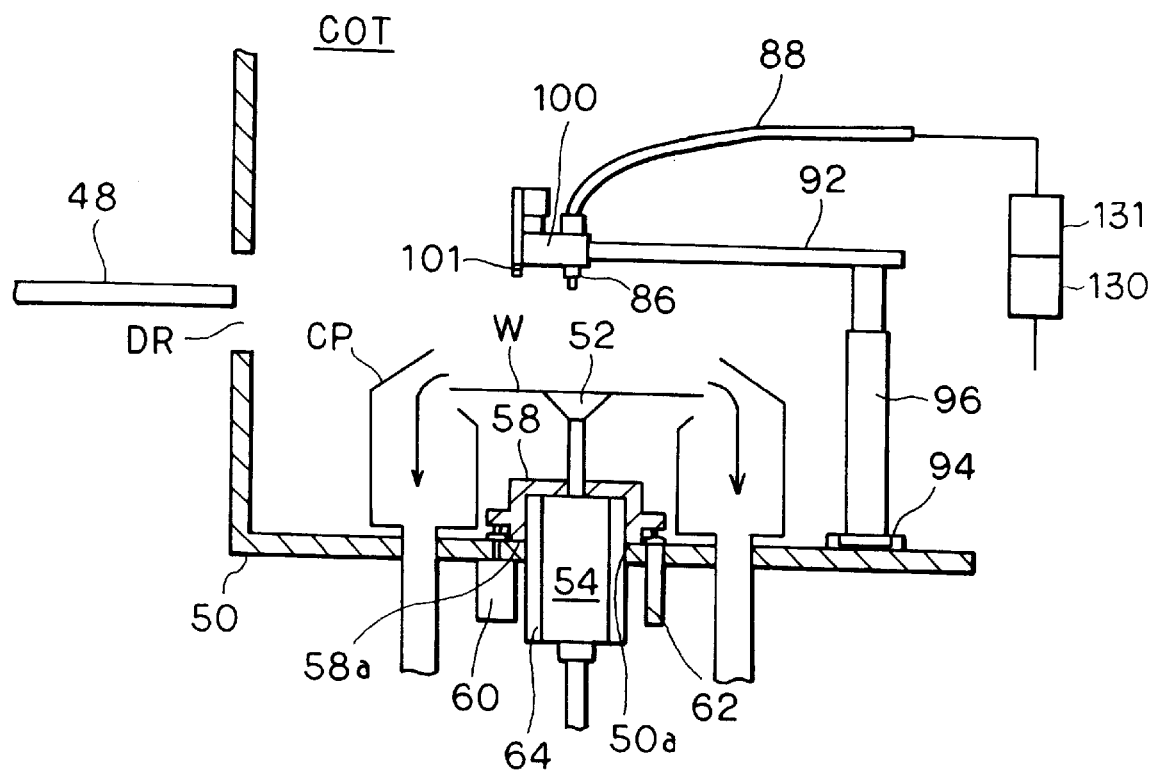
FIG. 4 is a sectional view showing the whole structure of a resist coating processing unit installed in the coating and developing processing system shown in FIG. 1.
Figure 5:
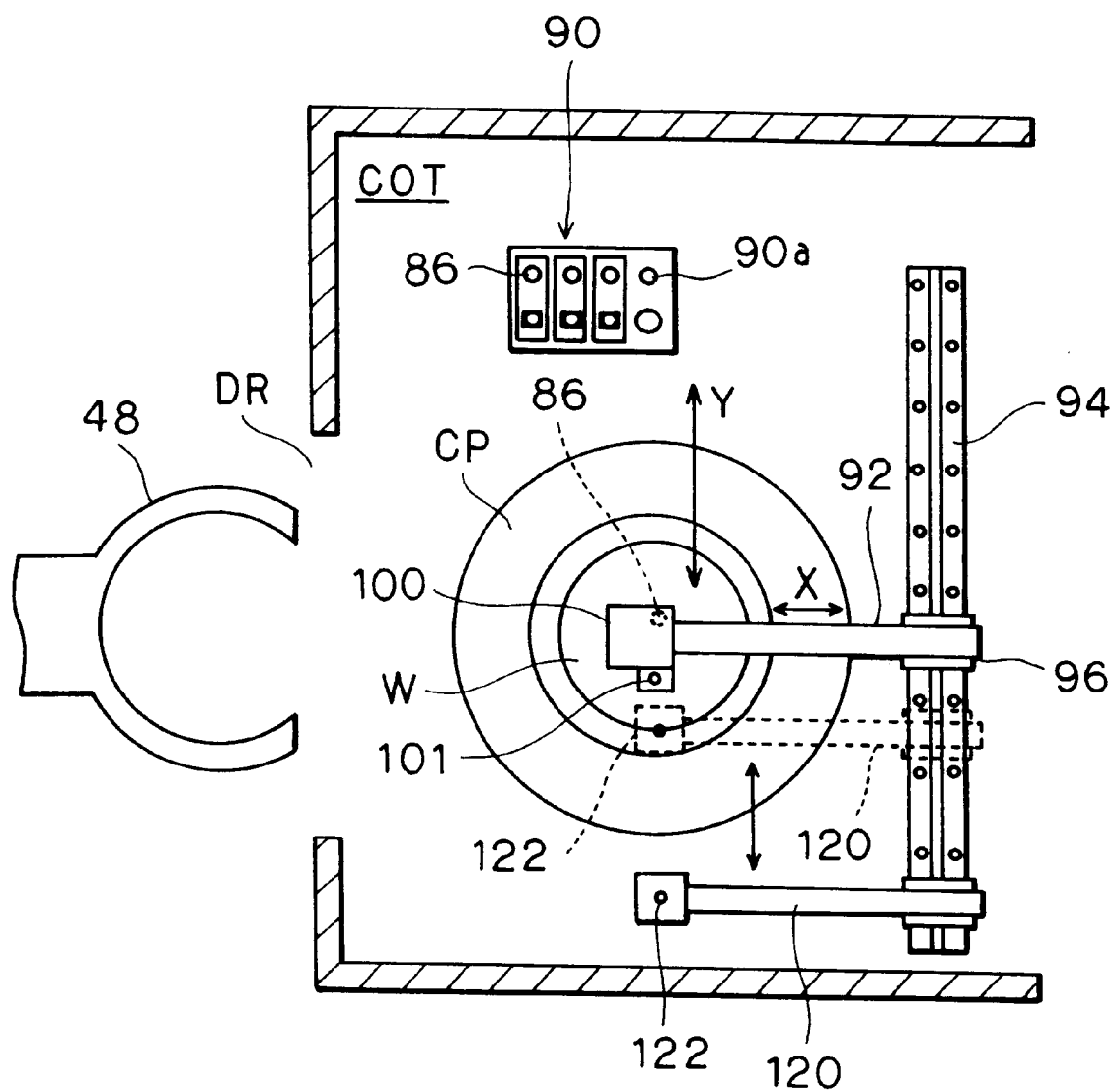
FIG. 5 is a plan view of the resist coating processing unit shown in FIG. 4.

Next, a resist coating processing unit (COT) in this embodiment will be described. FIG. 4 and FIG. 5 are almost sectional view and plan view respectively showing the whole structure of the resist coating processing unit (COT).

A ring-shaped cup CP is disposed at the center of the resist coating processing unit (COT), and a spin chuck 52 is disposed inside the cup CP. The spin chuck 52 is rotationally driven by a drive motor 54 while securely holding a wafer W by vacuum adherence. The drive motor 54 is disposed within an opening 50a provided in a unit bottom plate 50 to be ascendable and descendable, and is linked together with an ascent/descent drive means 60 consisting of, for example, an air cylinder and an ascent/descent guide means 62 with a cap-shaped flange member 58 made of, for example, aluminum therebetween.

On the side face of the drive motor 54, a cylindrical cooling jacket 64 made of, for example, SUS is attached, and the flange member 58 is attached in such a manner to cover the upper half of the cooling jacket 64.

When a resist is applied, a bottom end 58a of the flange member 58 contacts the unit bottom plate 50 in the vicinity of the periphery of the opening 50a, thereby keeping the inside of the unit airtight. When the wafer W is delivered between the spin chuck 52 and the holding members 48 of the main wafer transfer mechanism 22, the ascent/descent drive means 60 lifts the drive motor 54 or the spin chuck 52 upward, thereby the bottom end of the flange member 58 is ascended away from the unit bottom plate 50.

A resist nozzle 86 for discharging a resist solution onto the front face of the wafer W is joined to a resist supply pipe 88 to which an air-operated valve 130 and a suck back valve 131 are joined. The resist nozzle 86 is removably attached to the tip portion of a resist nozzle scan arm 92 with a nozzle holder 100 therebetween. The resist nozzle scan arm 92 is attached to the top end portion of a vertical support member 96 which can horizontally move on guide rails 94 laid on the unit bottom plate 50 in one direction (the Y-direction), so that it moves in the Y-direction integrally with the vertical support member 96 by a Y-direction drive mechanism (not shown).

Moreover, the resist nozzle scan arm 92 can move also in the X-direction orthogonal to the Y-direction for selectively attaching a resist nozzle 86 thereto at a resist nozzle standby section 90, and hence it moves also in the X-direction by an X-direction drive mechanism (not shown).

Further, a discharge port of the resist nozzle 86 is inserted into an aperture 90a of a solvent atmosphere chamber at the resist nozzle standby section 90 to be exposed to the atmosphere of the solvent therein, so that a resist solution at the nozzle tip does not solidify nor deteriorate. Moreover, a plurality of resists nozzles 86 are provided and these nozzles are properly used, for instance, corresponding to the type of resist solution.

Attached to the tip portion (the nozzle holder 100) of the resist nozzle scan arm 92 is a thinner nozzle 101 for discharging a solvent for moistening the front face of the wafer onto the front face of the wafer in advance of the discharge of the resist solution onto the front face of the wafer, for example, a thinner. The thinner nozzle 101 is joined to a thinner supply section with a solvent supply pipe (not shown) therebetween. The thinner nozzle 101 and the resist nozzle 86 are attached in such a manner that the respective discharge ports are positioned above a straight line along the Y-movement direction of the resist nozzle scan arm 92.

On the guide rails 94, provided are not only the vertical support member 96 for supporting the resist nozzle scan arm 92 but also a vertical support member 122 for supporting a side rinse nozzle scan arm 120 and movable in the Y-direction. A rinse nozzle 124 for side rinse is attached to the tip portion of the rinse nozzle scan arm 120. The Y-direction drive mechanism (not shown) translates or linearly moves the side rinse nozzle scan arm 120 and the rinse nozzle 124 between a side rinse nozzle standby position (a position shown by the solid line) which is set beside the cup CP and a rinse solution discharge position (a position shown by the dotted line) which is set direct above the peripheral portion of the wafer W mounted on the spin chuck 52.

Figure 6:
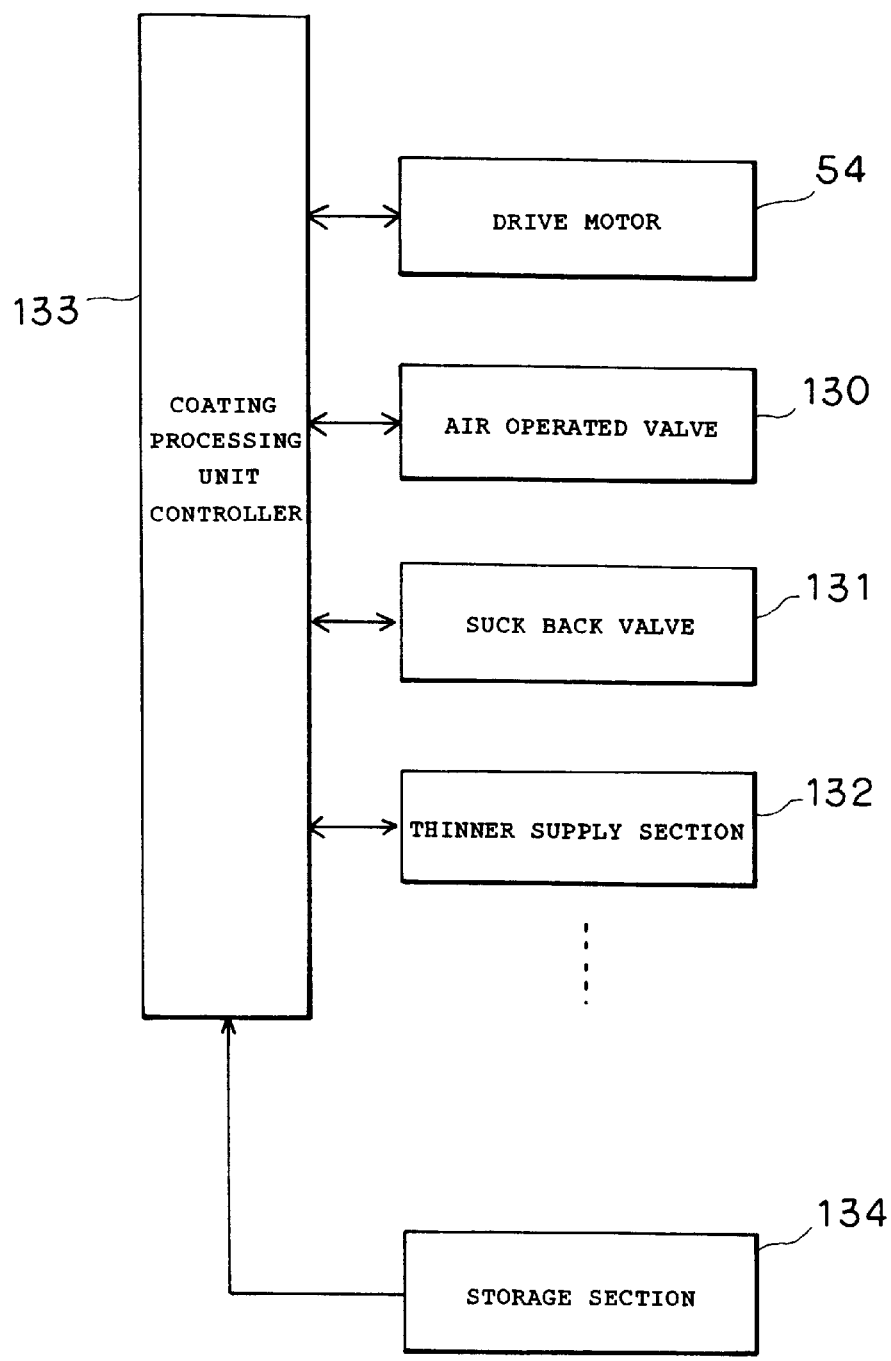
FIG. 6 is a diagram showing a configuration of a control system of the resist coating processing unit shown in FIG. 4 and FIG. 5.

FIG. 6 is a diagram showing a configuration of a control system of the resist coating processing unit (COT). A controller 133 of the coating processing unit controls each of sections in the resist coating processing unit (COT). For instance, it controls the drive motor 54 for rotating a wafer W, the air operated valve 130 for switching between supply and stop of a resist solution, the suck back valve 131 for sucking back the resist solution, and a thinner supply section 132 for supplying or stopping a thinner. Connected to the controller 133 is a storage section 134 in which recipe and other information required for processing.

Next, coating operations for the resist solution in the resist coating processing unit (COT) structured as above will be described.

When a wafer W is transferred to a position direct above the cup CP in the resist coating processing unit (COT) by the holding members 48 of the main wafer transfer mechanism 22, the wafer W is vacuum-adhered by the spin chuck 52 ascended by the ascent/descent drive means 60 consisting of, for example, an air cylinder and the ascent/descent guide means 62. After the wafer W is vacuum-adhered by the spin chuck 52, the main wafer transfer mechanism 22 takes back the holding members 48 from inside the resist coating processing unit (COT), thereby completing deliver of the wafer W to the resist coating processing unit (COT).

Sequentially, the spin chuck 52 with the wafer W descends to a predetermined position in the cup CP, and then the rotational drive of the spin chuck 52 is started by the drive motor 54.

Thereafter, the nozzle holder 100 is started to move from the resist nozzle standby section 90. The movement of the nozzle holder 100 is performed along the Y-direction.

As shown in FIG. 7A, after the discharge port of the thinner nozzle 101 reaches a position above the center of the spin chuck 52 (the center of the wafer W), the thinner is supplied onto the rotating wafer W. The thinner supplied onto the wafer W is spread out by centrifugal force from the center of the wafer W toward the whole region thereabout uniformly. The so-called pre-wet processing in which the whole front face of the semiconductor wafer W is moistened with a solvent such as a thinner or the like is performed as above before coating with a resist, thereby the resist easily diffuses resulting in that a uniform resist film can be formed with a smaller amount of the resist solution.

Then, the nozzle holder 100, as shown in FIG. 7B, is moved in the Y-direction until the discharge port of the resist nozzle 86 reaches a position above the center of the wafer W. In a state where the wafer W is rotated at a predetermined rotation speed, the resist solution is dripped from the discharge port of the resist nozzle 86 onto the center of the rotating wafer W and then diffused from the center of the wafer W toward the periphery thereof by centrifugal force, thereby forming a resist film on the wafer W. In the above, the wafer W is rotated at a comparatively high speed, for example, 3000 rpm or more from the viewpoint of reduction in amount of the resist consumed.

After the completion of the dripping of the resist solution, the rotation speed of the wafer W is reduced to a predetermined speed for a predetermined period of time as required, thereby the film thickness is adjusted. Then, the rotation speed of the wafer W is increased, so that the excess resist solution is drained and the wafer W is dried, thereby forming a resist film with a predetermined thickness.

Thereafter, the nozzle holder 100 is returned to the home position thereof. The back face of the wafer W is subjected to a back rinse by means of a cleaning means (not shown) and the rim portion of the wafer W is subjected to a side rinse by means of a cleaning means (not shown) as required. Then, the rotation speed of the wafer W is increased to drain the rinse solutions of the back rinse and the side rinse, and thereafter the rotation of the wafer W is stopped to complete the coating process.

Figure 8:
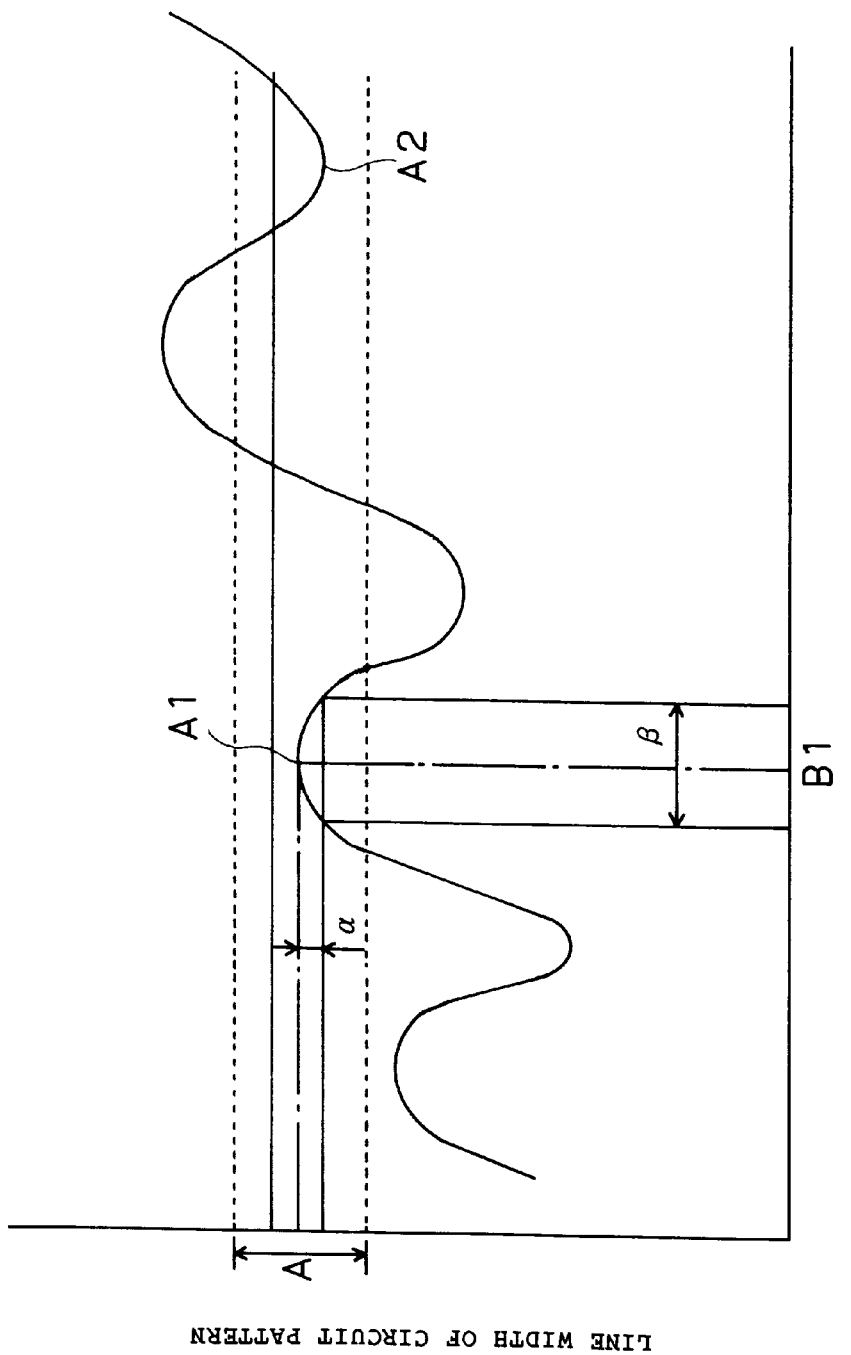
FIG. 8 is a graph schematically showing the relation between the film thickness of a resist film and the line width of a circuit pattern.

Next, the relation between the film thickness of a resist film and the line width of a circuit pattern will be explained with reference to FIG. 8. FIG. 8 is a graph showing the relation between the film thickness of a resist film and the line width of a circuit pattern. As shown in this graph, the line width of a circuit pattern varies in a wave form in correspondence with a resist film thickness. This results from that exposure strength varies due to interference between an incident wave incident into the resist film and a reflected wave reflected at the wafer W. More specifically, when the incident wave and the reflected wave are in phase, these strengthen each other to increase in exposure strength, resulting in a wide line width after development. When the incident wave is in antiphase with the reflected wave, these weaken each other to decrease in exposure strength, resulting in a narrow line width after development. The relation between the incident wave and the reflected wave is determined by the thickness of a resist film, as a result, the line width of a circuit pattern varies in a wave form in correspondence with the resist film thickness.

Here, such a curved line of the line width of a circuit pattern in correspondence with the resist film thickness is previously obtained so as to select a resist film thickness corresponding to a line width of an approximately maximum value or an approximately minimum value from among line widths within the designated region.

Specifically, in FIG. 8, when the region A is designated as the line width of the circuit pattern, the maximum value within the designated region is the A1 point and the minimum value is the A2 point. Accordingly, the line width of the approximately A1 point or the approximately A2 point is selected to form a resist film with the resist film thickness corresponding to the selected line width.

If the value of the maximum value A1 point is selected as the line width of the circuit pattern, the thickness of the resist film is B1 from the corresponding relation of the curved line graph in FIG. 8. As described above, when the line width corresponding to the maximum value of A1 point is selected and a resist film is formed regarding B1 as a target value of the film thickness, the thickness of the resist film actually formed on the wafer varies comparatively greatly within the range indicated by β as shown in the drawing. However, the line width of the circuit pattern, in correspondence with the above variations, varies only within a quite narrow a range near the maximum value A1 point, thus the variations in line width can be suppressed to be quite small.

In other words, variations in line width can be suppressed to be remarkably small when the resist film is formed, thus a circuit pattern can be formed with quite high accuracy.

Incidentally, even if the value of the minimum value A2 point is selected as the line width of the circuit pattern, variations in line width of the circuit pattern can be similarly reduced. However, though it depends on conditions such as the type of resist solution and the like, the curve of the line width variations in the drawing is generally milder near the maximum value than near the minimum value, therefore the use of the approximately maximum value can take a wider permissible range (margin) of variations in thickness of the resist film. However, when the approximately minimum value is used, there exists another advantage that the amount of exposure can be reduced.

The graph showing the relation between the thickness of a resist film and the line width of a circuit pattern in FIG. 8 changes in pattern corresponding to a wavelength of a light source for exposure in the aligner. This results from that exposure strength varies due to interference between an incident wave incident into the resist film and a reflected wave reflected at the wafer W as described above.

Accordingly, it is preferable that data of the relation between the film thickness of the resist film and the line width of the circuit pattern corresponding to the wavelength of the light source used for exposure processing is stored in the storage section 134 as a storage mechanism of the coating processing unit controller 133 as a control mechanism as described with FIG. 6, and a proper film thickness value of the resist film is obtained by setting the line width of the circuit pattern. In correspondence with the obtained film thickness value, conditions for determining the film thickness value of the resist film, for example, the rotation speed and the like in the resist coating process of a wafer W are changed so that the resist film is formed to have the target film thickness value.

Further, in a case where there exist a plurality of approximately minimum values or approximately maximum values within the region of the aforesaid target line width of a circuit pattern, the selection thereof is made as follows, for instance: ① In consideration of the running costs, the amount of the resist solution applied to the wafer W can be made small by selecting the value of the thinner in resist thickness, thereby reducing the amount of the resist solution consumed. ② In consideration of evenness and stability of the film thickness, the value which is wider in permissible range (margin) of variations in thickness of a resist film is selected out of the approximately minimum values and the approximately maximum values. ③ Selection in the process, for example, a state of a base to be coated with the resist solution: the approximately minimum value is selected for the resist film, for example, on an insulating layer, thereby the amount of exposure (for example, in a case where the resist film thickness is thicker at the approximately maximum value, accordingly, in a case where the resist film thickness is thinner at the approximately minimum value) is saved resulting in improvement of processing throughput. Meanwhile, the approximately maximum value (from the evenness and stability as described in the aforesaid ②) is selected for the resist film, for example, on an interconnection layer, thereby the permissible margin of variations in thickness of a resist film can be made wide resulting in prevention of problems such as a short and the like of a pattern with more reliability. The selection conditions as to which one of the film thickness of a resist film should be selected from among the approximately minimum values or the approximately maximum values through consideration from ① through ③ or combinations thereof, are also stored in the storage section 134 as a storage mechanism of the coating processing unit controller 133 as a control mechanism as described with FIG. 6. It is preferable that a film thickness condition of a resist film is taken out by the coating processing unit controller 133 through the above selection conditions and setting of the exposure wavelength and the line width of a circuit pattern, and the resist coating processing for the wafer W is automatically performed based on that film thickness condition.

As shown in the graph showing the relation between the film thickness of a resist film and the line width of a circuit pattern in FIG. 8, if it is assumed that in a case where a region of the line width of a circuit pattern is set and the approximately maximum value is first appeared in the film thickness of the resist film based on the aforesaid region, that is, the region of the line width of the circuit pattern is satisfied with the film thickness of a thinner side of the resist film, the approximately maximum value can take a permissible range (margin) of variations in thickness of the resist film wider than the approximately minimum value, it is preferable to select a predetermined value of the first (counted from the thin film thickness) approximately maximum value corresponding to the region of the line width of the circuit pattern because of the advantages that evenness is excellent and the amount of the resist solution consumed can be restrained. Conversely, if it is assumed that in a case where a region of the line width of a circuit pattern is set and the approximately minimum value is first appeared in film thickness of the resist film based on the region, that is, the region of the line width of the circuit pattern is satisfied with the film thickness of a thinner side of the resist film, the approximately minimum value can take a permissible range (margin) of variations in thickness of the resist film wider than the approximately maximum value, it is, of course, possible to select a predetermined value of the first (counted from the thin film thickness) approximately minimum value corresponding to the region of the line width of the circuit pattern because of the advantages that evenness is excellent and the amount of the resist solution consumed can be restrained.

Figure 9:
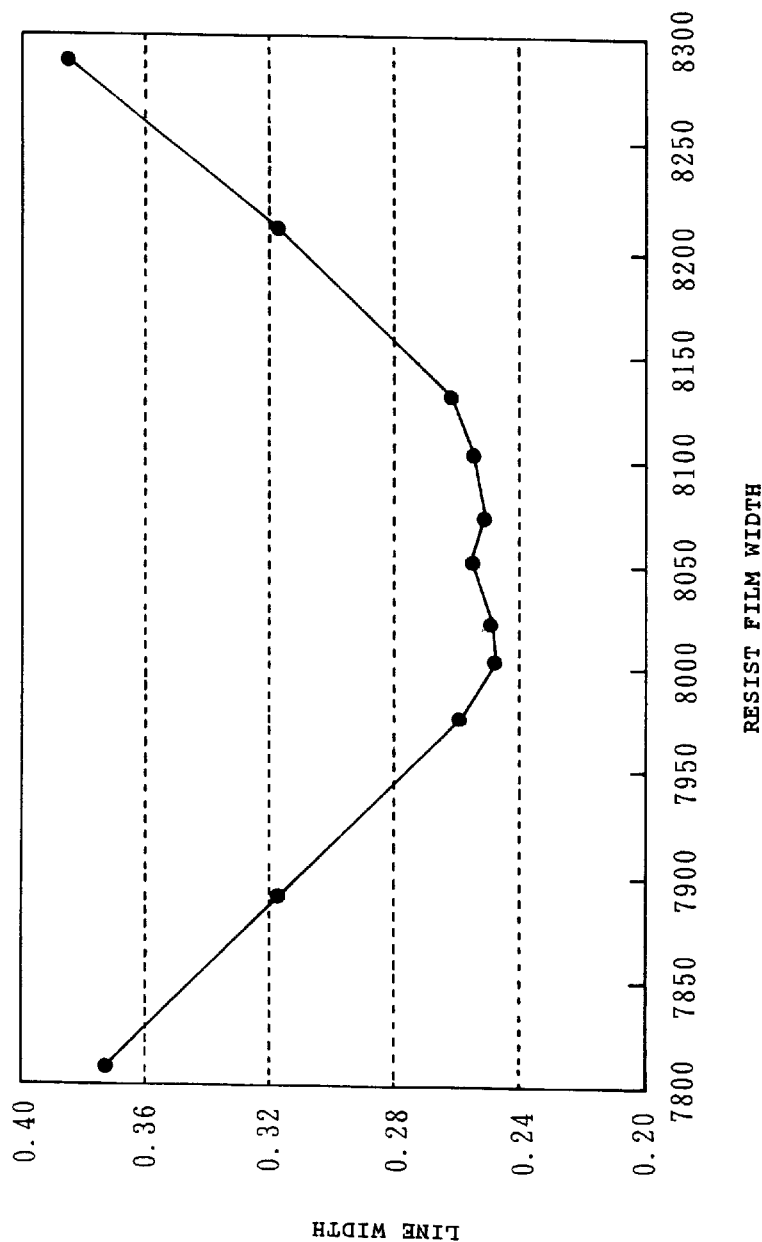
FIG. 9 is a graph showing the relation between the actual film thickness of a resist film and the line width of a circuit pattern.

FIG. 9 shows the relation between the film thickness of the resist film and the line width of the circuit pattern when resist coating, exposure, and development are actually performed on a wafer W. Here, about 0.25 $\mu$m corresponding to the minimum value is selected as the line width of the circuit pattern, and in correspondence with the above value, the film thickness of the resist film is set to be about 8050A (angstrom).

As shown in this graph, even if the film thickness varies within a range of, for example, 8000A to 8100A, the line width stays near 0.25 $\mu$m and hardly varies. In other words, it is confirmed that variations in line width of a circuit pattern corresponding to the changes in resist film thickness can be remarkably reduced, as described above.

To determine the resist film thickness which is hard to vary in line width based on the relation between the resist film thickness and the line width of the circuit pattern, it is preferable that the above relation is stored in the storage section 134 in FIG. 6, the resist film thickness is calculated in the unit controller 133 based on the information, and the rotation condition of the spin chuck 52 and the amount of resist solution discharged from the resist nozzle 86 are properly controlled by the unit controller 133 so that the film thickness of the resist film becomes the calculated film thickness.

Figure 10:
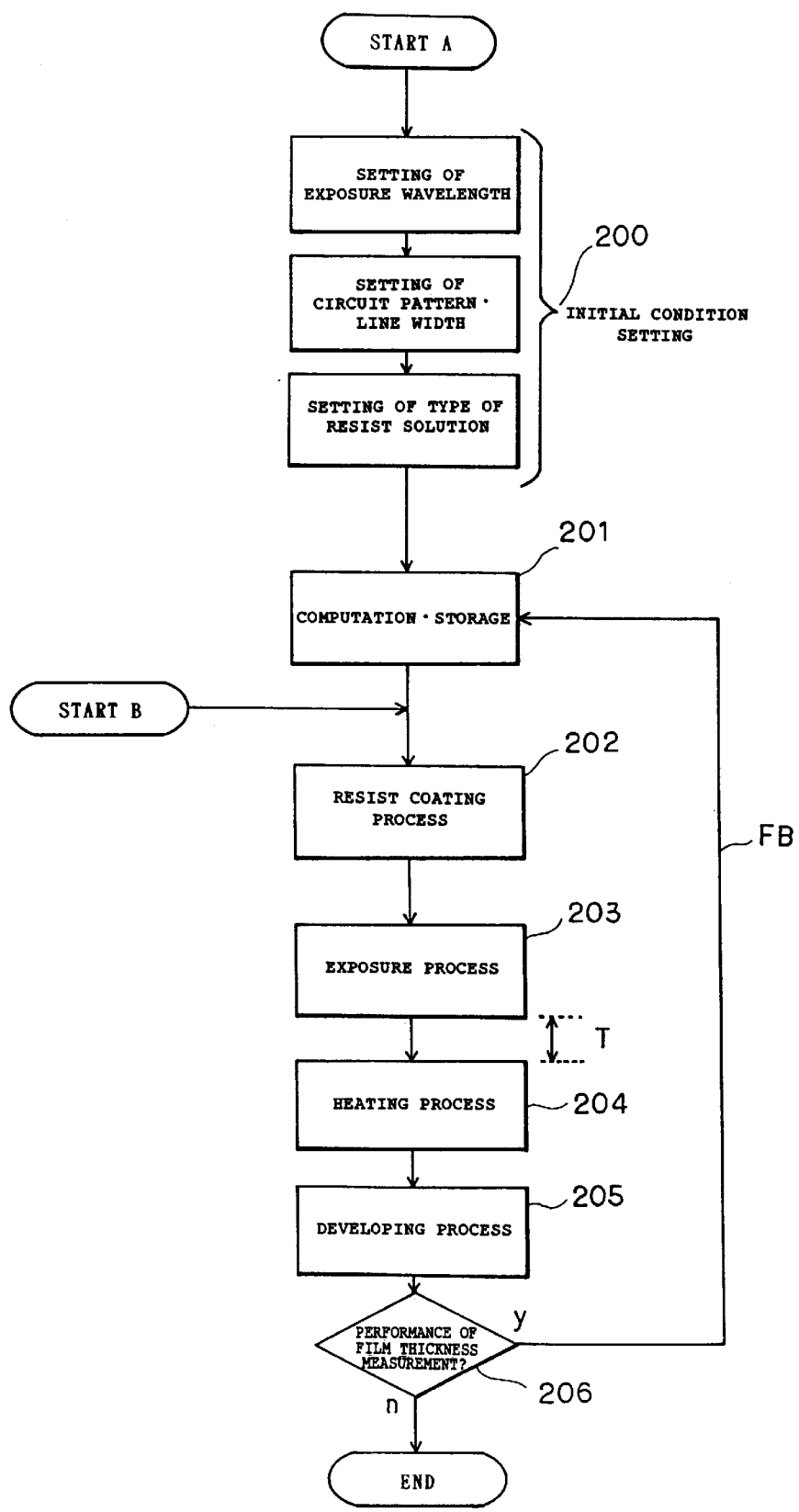
FIG. 10 is a diagram showing an example of a flow for selecting the film thickness of a resist film.

An example of a flow for selecting the film thickness of a resist film is shown in FIG. 10.

The flow for selecting the film thickness of a resist film shows a need to perform initial condition setting 200 first (from START-A). In other words, setting of initial conditions such as setting of the wavelength of the light source in exposure, setting of the line width of the circuit pattern, setting of the permissible range and the like of the line width of the circuit pattern, setting of the type of resist, and the like are performed. Next, predetermined conditions in the resist coating process and the like are computed based on the table of the relation between the resist film thickness and the line width of the circuit pattern stored in the aforesaid coating processing unit controller 133, and the result is once stored in the storage section 134. Next, a wafer W is subjected to coating processing 202 with a resist solution based on the conditions stored in the storage section 134. After heating processing and cooling processing, the wafer W is subjected to exposure processing 203 by energy of a predetermined wavelength. Next, developing processing is performed on the wafer W to form a predetermined pattern. After developing processing has once completed, it is decided whether the resist film thickness is measured or not. The timing of measurement of the resist film thickness can be set in such a manner to perform once per one lot, or once per a plurality of lots. Moreover, it may be performed to the first wafer W in the same processing or to a dummy wafer. As described above, when the resist film thickness is measured, this measured data is fed back FB by the coating processing unit controller 133 and is subjected to comparative computation with the setting data of the initial conditions stored in the storage section 134, and it is decided whether the measured data exists within predetermined values or not. If the data exists within the predetermined values, the following wafer W starts from START-B and is sequentially subjected to processes in order under the same conditions as those in the preceding time. If the data does not exist within the predetermined values, new setting conditions for correcting or proofreading the error are derived by the comparative computation between the data fed back FB by the coating processing unit controller 133 and the setting data of the initial conditions stored in the storage section 134 and stored in the storage section 134. Based on the storage data in the storage section 134, the aforesaid processes are sequentially repeated. Incidentally, the storage data in the storage section 134 is preferably managed for each wafer W, because, for instance, an operator and the like can comparatively review the setting for a wafer W with problems and the setting for a wafer W without problems later.

Further, items to be changed for the new setting conditions in a case where the data does not exist within the predetermined values, as described above, are naturally the rotation speed of a wafer W, the amount of the resist solution discharged and the like in the resist coating process 202. A period of time T from a predetermined point of time when a wafer W is processed in the exposure process 203 to the following heating process 204 may be changed, for example. This is because the time T is a factor exerting influence in no small way on the line width of a circuit pattern.

Figure 11:
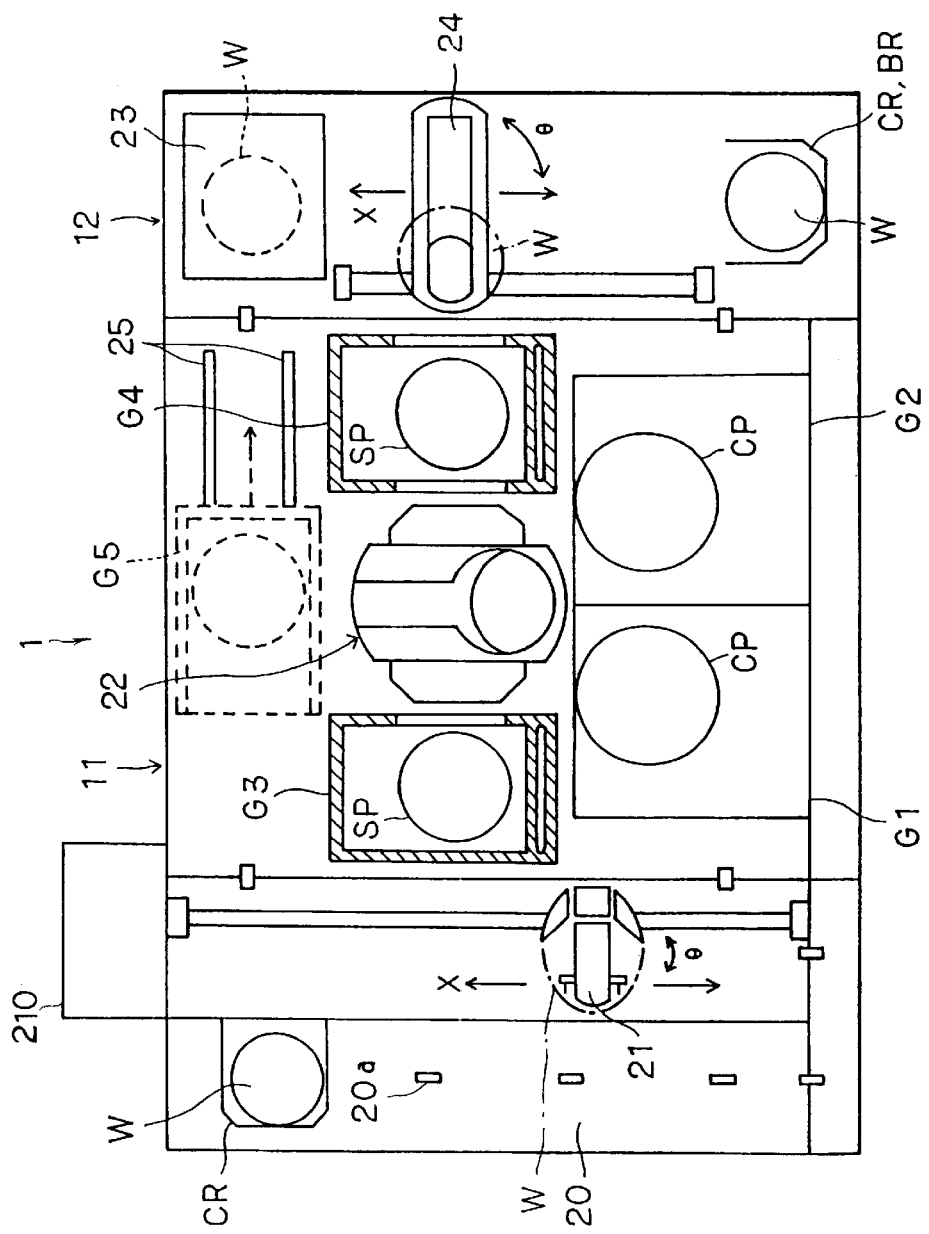
FIG. 11 is a plan view showing the whole structure of a coating and developing processing system for a semiconductor wafer, which is another embodiment of the present invention.
Figure 12:
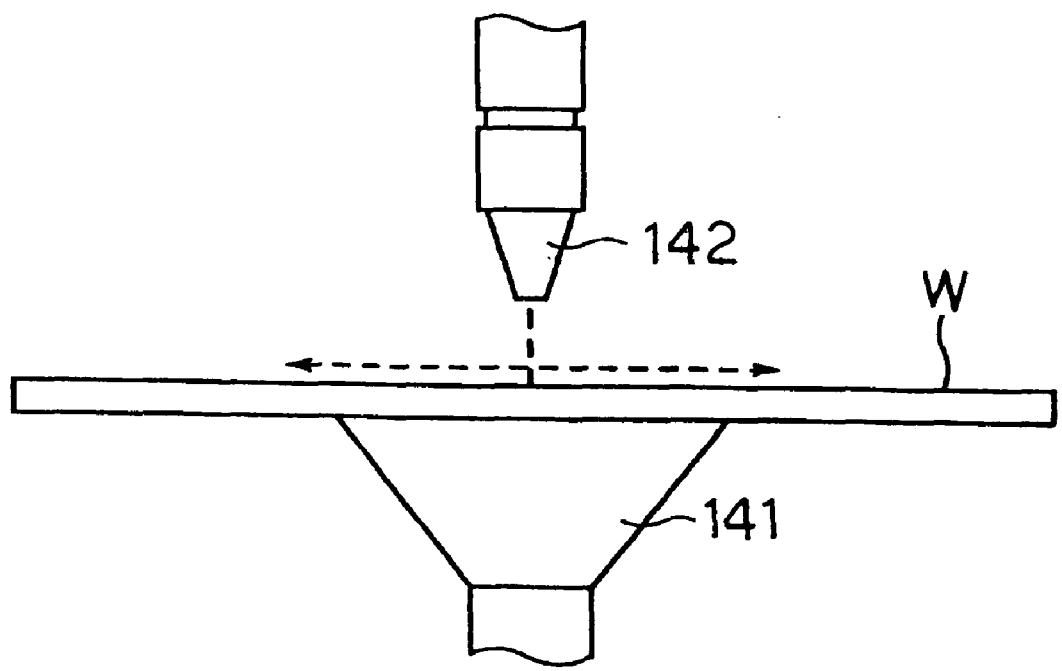
FIG. 12 is a block diagram of a conventional resist coating processing unit.

It should be noted that as a film thickness measurement device for measuring the film thickness, for example, a film thickness measurement device 210 is provided by the side of the cassette station 10 for delivering a wafer W to/from the wafer cassette CR of the coating and developing processing system 1 as shown in FIG. 11. The film thickness measurement device 210 may be provided in the processing station 11 in which various processing units are multi-tiered at designated positions and each processing unit gives predetermined processing to the wafers W one by one in a coating and developing process. With the above configuration, for instance, at least one film thickness measurement device 210 must be provided for each of a plurality of coating and developing processing systems 1, thus the devices cost high. Accordingly, it is preferable that the film thickness measurement device 210 is provided by the side of the cassette station 10 which can be detached when the film thickness measurement device 210 is used in a plurality of coating and developing processing systems 1 and can serve as a transfer mechanism for transferring wafers in/out by itself. It is not preferable that the film thickness measurement device 210 is provided in the processing station 11 and is detached to use in a plurality of coating and developing processing systems 1, because there occur variations in air flows and pressure in the processing station 11 due to the removal of the film thickness measurement device 210.

Moreover, the measurement of the film thickness by the film thickness measurement device is performed after a developing process, and it may be performed after a resist coating process and before an exposure process.

Further, the present invention is not limited to the above embodiments and various modifications are possible. For instance, though a coating apparatus for coating a semiconductor wafer with a resist solution has been described in the above embodiments, the present invention can be applied in a case where another substrate to be processed such as an LCD substrate, in addition to the semiconductor substrate, is coated with a resist solution.

As has been described, according to the present invention, since a relation between the film thickness of a resist film and the line width of a circuit pattern when the resist film is exposed into a predetermined pattern and thereafter developed is obtained in advance, from that relation, a line width with less variations corresponding to the changes in film thickness of the resist film is selected from among line widths within a designated region to form the resist film to have the film thickness corresponding to the selected line width, a line width of the circuit pattern after development can be made to resist variation regardless of changes in film thickness of the resist film formed on the substrate. Consequently, the circuit pattern can be made quite accurate.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A method of forming a resist film on a substrate, comprising the steps of:

(a) determining a process condition for a resist film formation by means of a computer, including the steps of:

(i) inputting into the computer values of first parameters specifying the process condition and including a wavelength of a light used for exposing the resist film and a type of resist solution and a value of a line width of a circuit pattern, (ii) determining via computer analysis a thickness value of the resist film to be formed on the substrate, based on a relationship expressing the line width of the circuit pattern as a function of the thickness of the resist film, the thickness value thus determined corresponding to an. extreme value of the function, the relationship being experimentally obtained beforehand and stored in the computer; and (iii) determining via automatic computer analysis values of second parameters specifying the process condition together with the first parameters, wherein the thickness value determined in step (ii) can be obtained under the process condition specified by the values of the first and the second parameters; and (b) forming a resist film on the substrate, by a resist film forming apparatus controlled by the computer, under the process condition specified by the values of the first and the second parameters.

2. The method according to claim 1, wherein the second parameters include:

a rotational speed of the substrate when the resist solution is applied onto the substrate;

an amount of the resist solution to be applied onto the substrate; and a period of time to wait after completion of resist solution exposure before starting a substrate heating step.

3. The method according to claim 1, further comprising the steps of:

(c) measuring a measured line width of a circuit pattern formed in the step (b);

(d) comparing via automatic computer analysis the measured line width with the circuit pattern line width value under the processing condition determined in the step (iii);

(e) changing at least one of the values of the second parameters by the computer automatically, if the measured line width is outside a predetermined range of the line width which should be obtained under the processing condition determined in the step (iii); and (f) executing step (b) under the processing condition specified by the values of the first parameters and the values of the second parameter determined in step (e).

4. The method according to claim 3, wherein the second parameters include:

a rotational speed of the substrate when the resist solution is applied onto the substrate;

an amount of the resist solution to be applied onto the substrate; and a period of time to wait after completion of resist solution exposure before starting a substrate heating step; and wherein at least one of the values of the second parameters are changed in the step (e).

5. The method according to claim 1, wherein the function has a plurality of extreme values, and the extreme value used in the step (ii) is an extreme value corresponding to a minimum value of resist film thickness.

\* \* \* \* \*